(12) United States Patent
Huang et al.

(10) Patent No.: US 12,094,835 B2
(45) Date of Patent: Sep. 17, 2024

(54) WIRE BONDING METHOD AND APPARATUS FOR ELECTROMAGNETIC INTERFERENCE SHIELDING

(71) Applicant: Adeia Semiconductor Technologies LLC, San Jose, CA (US)

(72) Inventors: Shaowu Huang, Sunnyvale, CA (US); Javier A. Delacruz, San Jose, CA (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 0 days.

(21) Appl. No.: 18/377,706

(22) Filed: Oct. 6, 2023

(65) Prior Publication Data

US 2024/0162162 A1    May 16, 2024

Related U.S. Application Data

(63) Continuation of application No. 17/721,154, filed on Apr. 14, 2022, now Pat. No. 11,837,556, which is a
(Continued)

(51) Int. Cl.
*H01L 23/552* (2006.01)
*H01L 21/56* (2006.01)
*H01L 23/31* (2006.01)

(52) U.S. Cl.
CPC .......... *H01L 23/552* (2013.01); *H01L 21/566* (2013.01); *H01L 23/3121* (2013.01); *H01L 2224/48091* (2013.01); *H01L 2224/48227* (2013.01); *H01L 2224/49171* (2013.01); *H01L 2924/15311* (2013.01); *H01L 2924/19105* (2013.01); *H01L 2924/19107* (2013.01); *H01L 2924/3025* (2013.01)

(58) Field of Classification Search
CPC .............. H01L 23/552; H01L 23/3121; H01L 2224/48091
See application file for complete search history.

(56) References Cited

U.S. PATENT DOCUMENTS

| | | |
|---|---|---|
| 7,928,552 B1 | 4/2011 | Cho et al. |
| 8,373,264 B2 | 2/2013 | Welch et al. |
| | (Continued) | |

OTHER PUBLICATIONS

Bang, U.S. Appl. No. 10/656,534, filed Sep. 5, 2003.
(Continued)

*Primary Examiner* — Errol V Fernandes
(74) *Attorney, Agent, or Firm* — Haley Guiliano LLP

(57) ABSTRACT

Apparatuses relating generally to a microelectronic package having protection from electromagnetic interference are disclosed. In an apparatus thereof, a platform has an upper surface and a lower surface opposite the upper surface and has a ground plane. A microelectronic device is coupled to the upper surface of the platform. Wire bond wires are coupled to the ground plane with a pitch. The wire bond wires extend away from the upper surface of the platform with upper ends of the wire bond wires extending above an upper surface of the microelectronic device. The wire bond wires are spaced apart from one another to provide a fence-like perimeter to provide an interference shielding cage. A conductive layer is coupled to at least a subset of the upper ends of the wire bond wires for electrical conductivity to provide a conductive shielding layer to cover the interference shielding cage.

15 Claims, 14 Drawing Sheets

Related U.S. Application Data continuation of application No. 16/833,445, filed on Mar. 27, 2020, now Pat. No. 11,335,647, which is a continuation of application No. 15/914,617, filed on Mar. 7, 2018, now Pat. No. 10,658,302, which is a continuation of application No. 15/237,936, filed on Aug. 16, 2016, now Pat. No. 9,935,075.

(60) Provisional application No. 62/368,423, filed on Jul. 29, 2016.

(56) References Cited

U.S. PATENT DOCUMENTS

| | | | |
|---|---|---|---|
| 8,399,972 | B2 | 3/2013 | Hoang et al. |
| 9,508,658 | B1 | 11/2016 | Convert et al. |
| 2011/0084368 | A1 | 4/2011 | Hoang et al. |
| 2016/0049374 | A1 | 2/2016 | Lobianco et al. |

OTHER PUBLICATIONS

Brochure, "High Performance BVA PoP Package for Mobile Systems," Invensas Corporation, May 2013, 20 pages.
Brochure, "Invensas BVA PoP for Mobile Computing: 100+ GB/s BVA PoP," Invensas Corporation, c. 2012, 2 pages.
Brochure, "Invensas BVA PoP for Mobile Computing: Ultra High 10 Without TSVs," Invensas Corporation, Jun. 26, 2012, 4 pages.
EE Times Asia "Freescale Cuts Die Area, Thickness with New Packaging Tech" [online] [Retrieved Aug. 5, 2010] Retrieved from internet: <http://www.eetasia.com/ART_8800428222_280300_NT_DEC52276.htm>, Aug. 3, 2006, 2 pages.
NITK HTCC Package General Design Guide, Communication Media Components Group, NGK Spark Plug Co., Ltd., Komaki, Aichi, Japan, Apr. 2010, 32 pages.
Nleo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003, 34 pages.
North Corporation, Processed intra-Layer Interconnection Material for PWBs [Etched Copper Bump with Copper Foil], NIMBITM, Version 2001.6.
Redistributed Chip Package (RCP) Technology, Freescale Semiconductor, 2005, 6 pages.
U.S. Office Action for U.S. Appl. No. 12/769,930, mailed May 5, 2011.
Yoon, PhD, Seung Wook, "Next Generation Wafer Level Packaging Solution for 3D Integration," May 2010, STATS ThipPAC Ltd.
Campos, et al., "System in Package Solutions Using Fan-Out Wafer Level Packaging Technology", SEMI Networking Day, Jun. 27, 2013, 31.
IBM, et al., "Method of Producing Thin-Film Wirings with Vias", IBM Technical Disclosure Bulletin, IBM Corp., (Thornwood), US-ISSN 0018-8689, vol. 31, No. 11, https://priorart.ip.com., Apr. 1, 1989, 209-210.
Jin, Yonggang, et al., "STM 3D-IC Package and 3D eWLB Development", STMicroelectronics Singapore/STMicroelectronics France, May 21, 2010, 28 pages.
Kim, et al., "Application of Through Mold Via (TMV) as PoP Base Package", 2008, 6 pages.
Meiser, S., "Klein Und Komplex", Elektronik Id Press Ltd, DE, vol. 41, No. 1, Jan. 7, 1992 (Jan. 7, 1992) pp. 72-77, KP000277326, [ISR Appin. No. PCT/US2012/060402, dated Feb. 21, 2013 provides concise stmt. Of relevance).

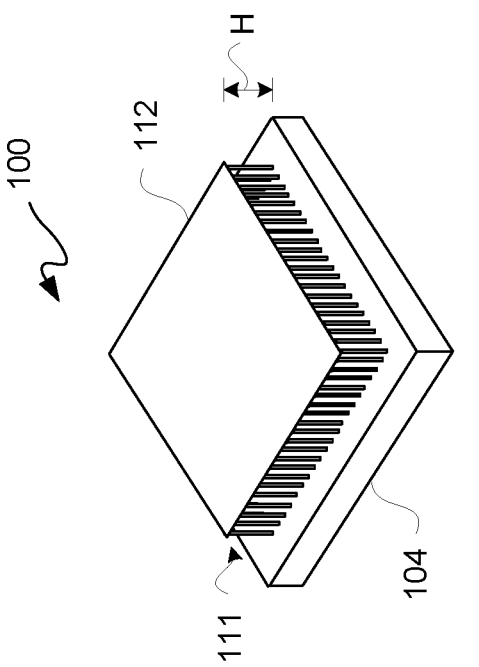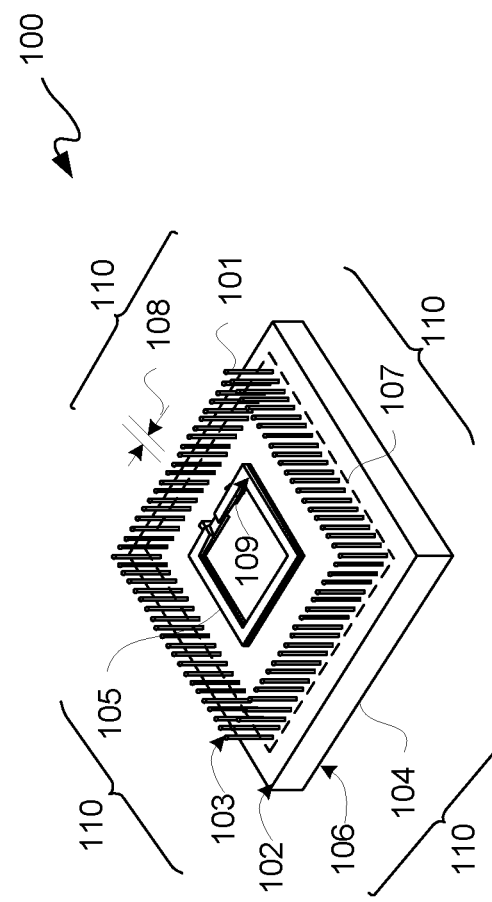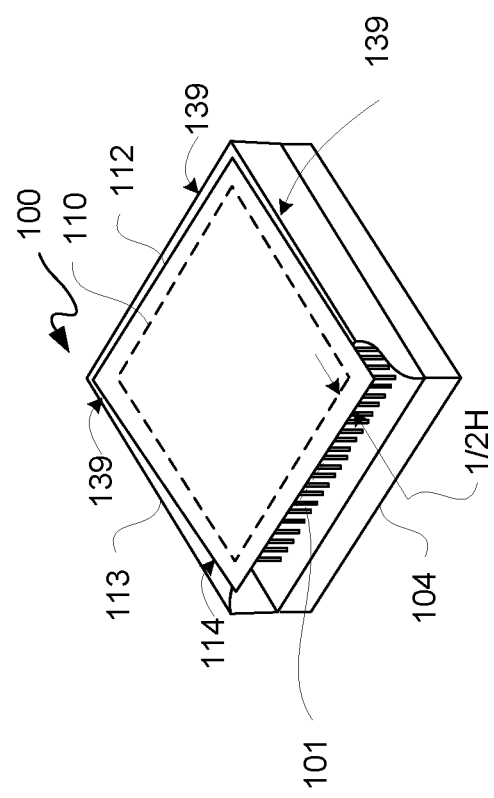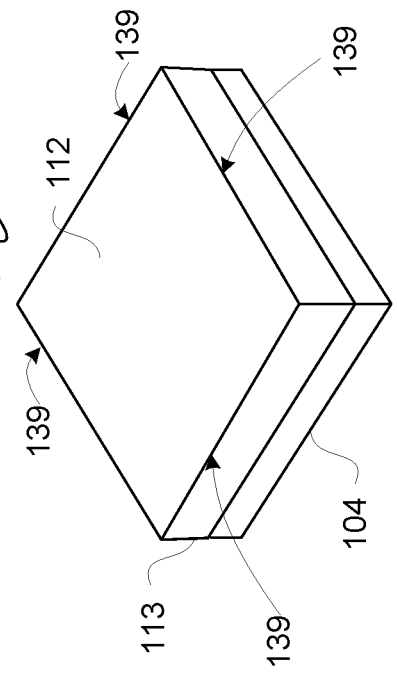

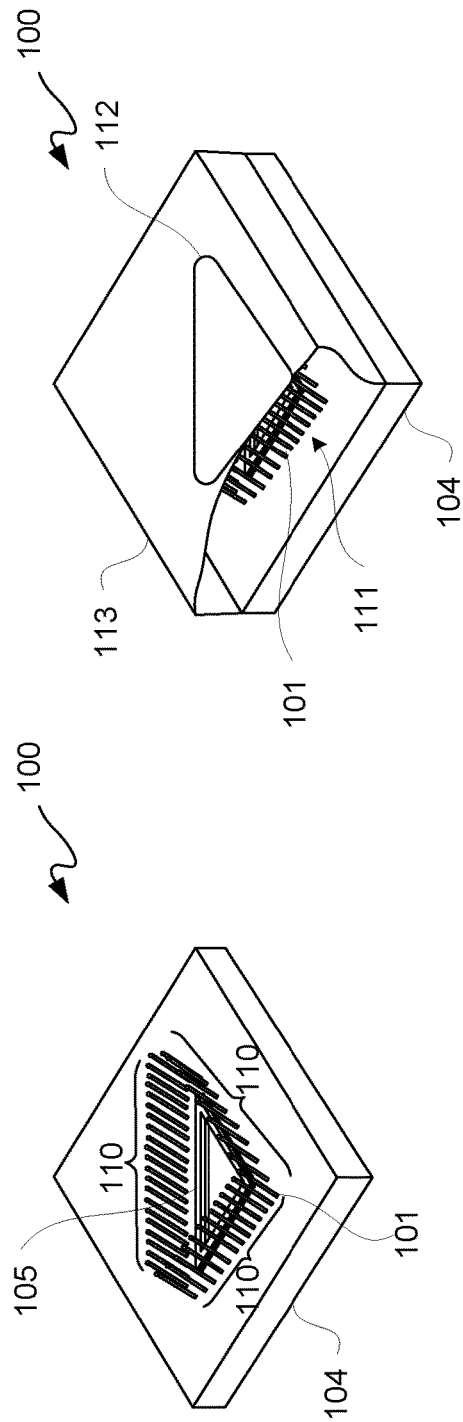
FIG. 4-1
FIG. 4-2
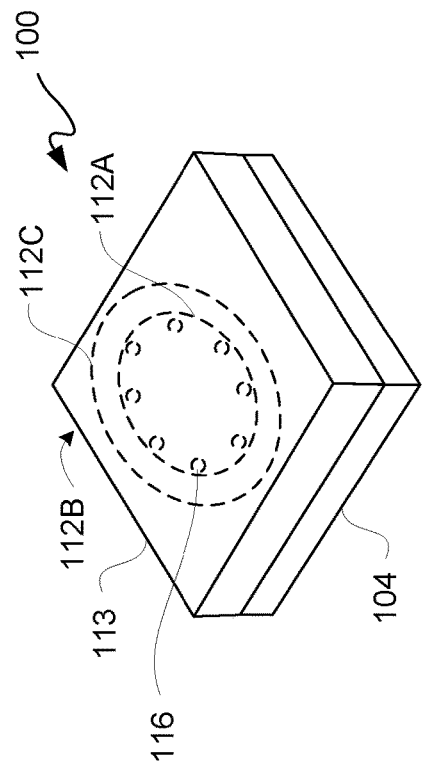
FIG. 5

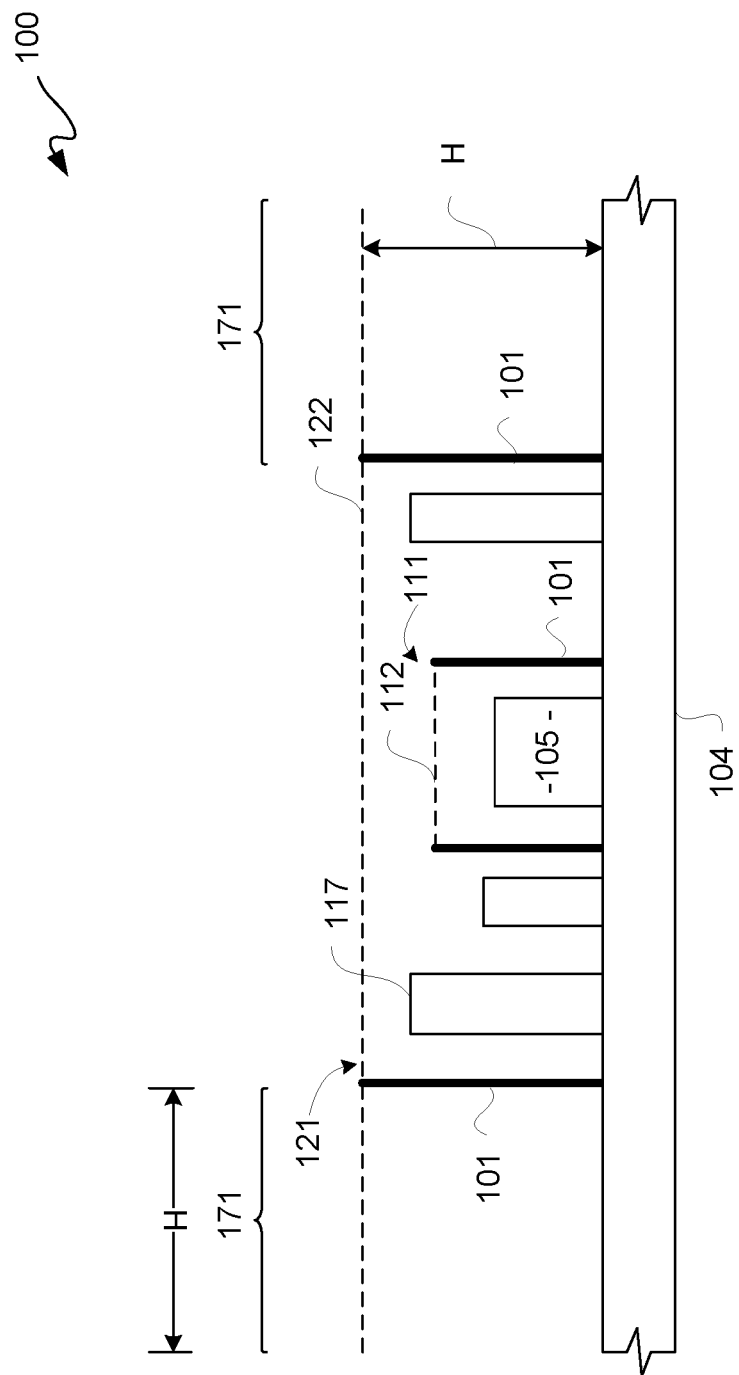

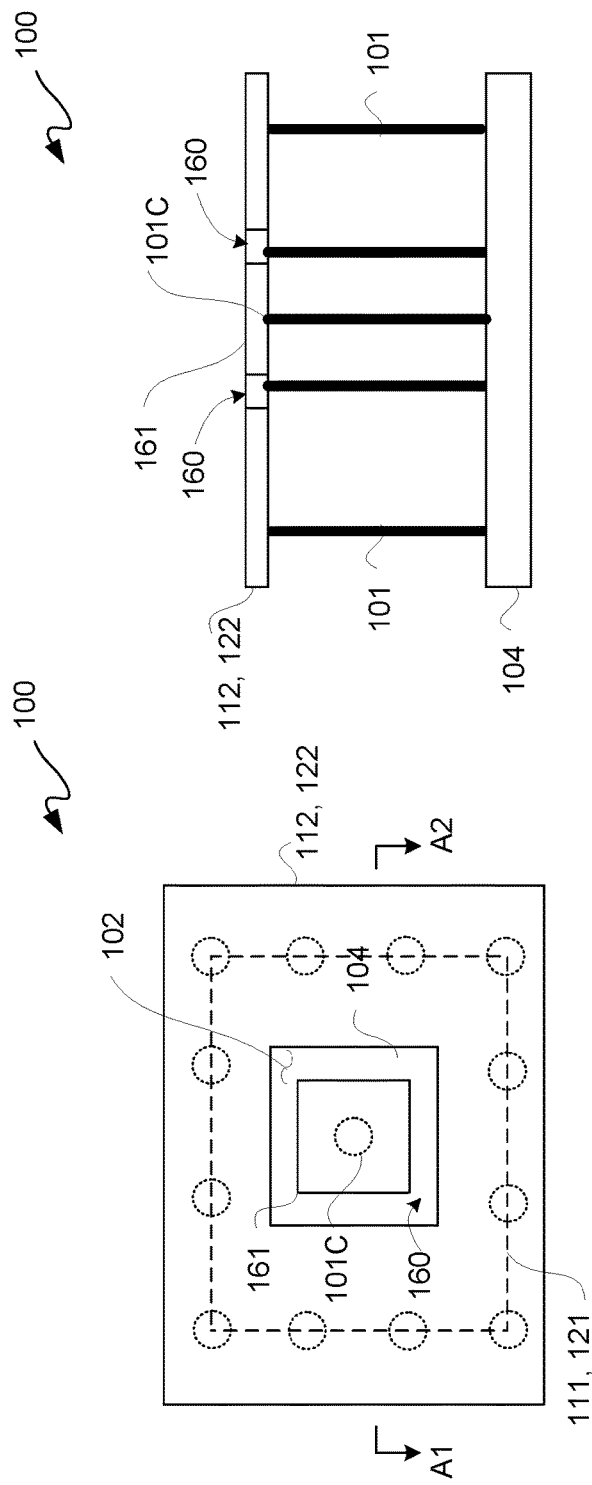
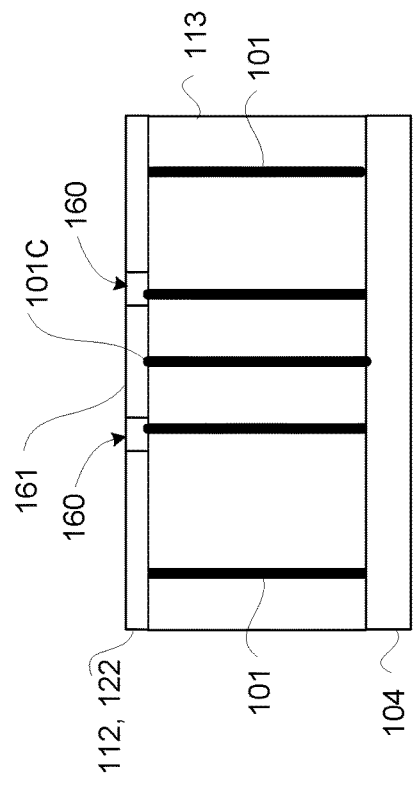

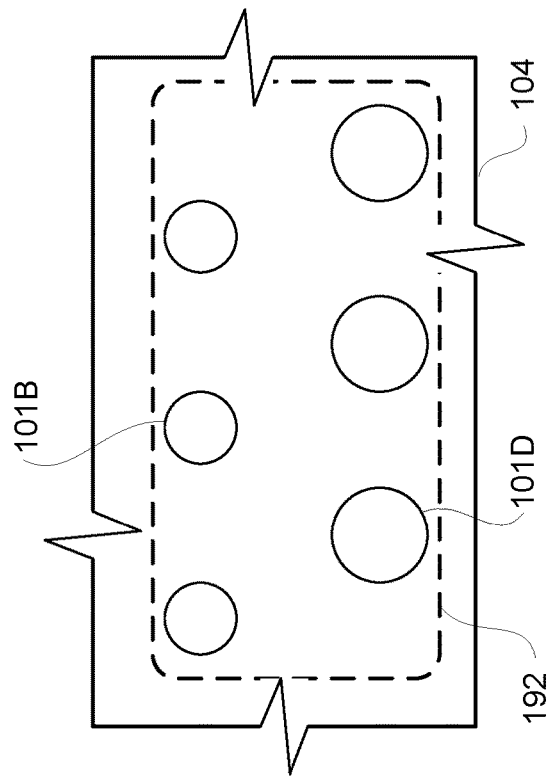
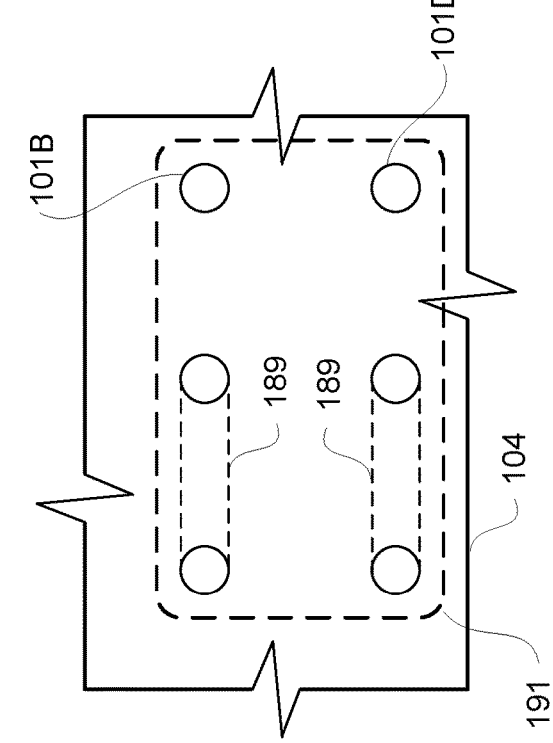
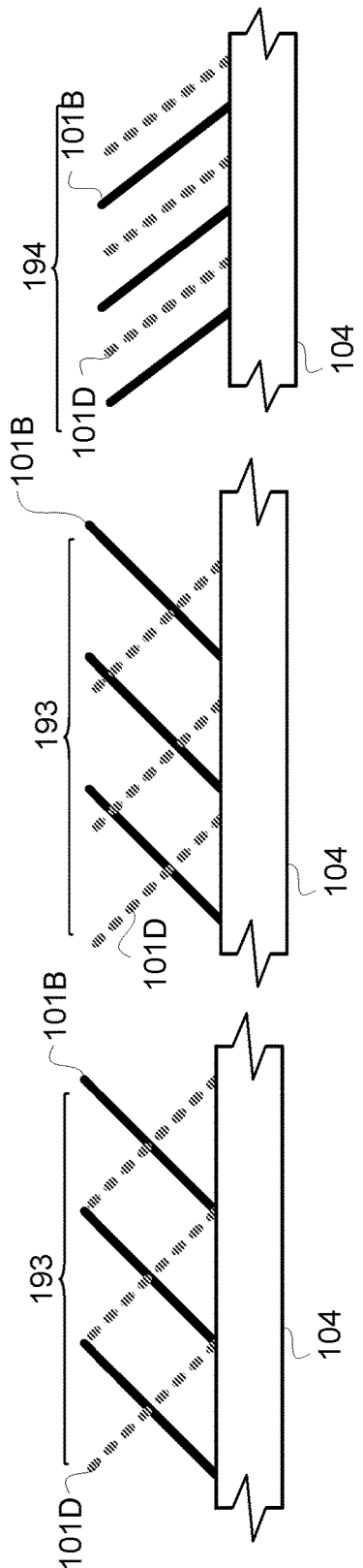

WIRE BONDING METHOD AND APPARATUS FOR ELECTROMAGNETIC INTERFERENCE SHIELDING

CROSS-REFERENCE TO RELATED APPLICATIONS

This application is a continuation of U.S. patent application Ser. No. 17/721,154, filed Apr. 14, 2022, which is a continuation of U.S. patent application Ser. No. 16/833,445, now U.S. Pat. No. 11,335,647, filed Mar. 27, 2020, which is a continuation of U.S. patent application Ser. No. 15/914,617, now U.S. Pat. No. 10,658,302, filed Mar. 7, 2018, which is a continuation of U.S. patent application Ser. No. 15/237,936, now U.S. Pat. No. 9,935,075, filed Aug. 16, 2016, which claims the benefit of U.S. Provisional Application No. 62/368,423, filed Jul. 29, 2016. The disclosures of which are hereby incorporated by reference herein in their entireties.

FIELD

The following description relates generally to integrated circuits ("ICs"). More particularly, the following description relates generally to wire bonding for electromagnetic interference shielding.

BACKGROUND

Some passive or active microelectronic devices may be shielded from electromagnetic interference ("EMI"), including without limitation radio frequency interference ("RFI"). However, conventional shielding may be complicated to fabricate, too heavy for some mobile applications, too expensive to produce and/or assemble, and/or too large for some low-profile applications. Moreover, some shielding may not be suitable for a stacked die or a stacked package, generally referred to as three-dimensional ("3D") ICs or "3D ICs."

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 1-1 is a top-down perspective view illustratively depicting an exemplary microelectronic package having interference protection.

FIG. 1-2 is the top-down perspective view illustratively depicting the exemplary microelectronic package of FIG. 1-1 after the addition of a conductive layer.

FIG. 1-3 is a cut-away diagram of the top-down perspective view illustratively depicting the exemplary microelectronic package of FIG. 1-1 after the addition of a molding layer and a conductive layer.

FIG. 1-4 is a block diagram of the top-down perspective view illustratively depicting the exemplary microelectronic package of FIG. 1-1 after the addition of a molding layer and a conductive layer, where conductive layer covers an upper surface of the microelectronic package.

FIGS. 2-1 through 2-7 are respective block diagrams of side views illustratively depicting exemplary profiles of wire bond wires.

FIG. 3-1 is the exemplary microelectronic package of FIG. 1-3 though with slash-like shaped wire bond wires.

FIG. 3-2 is the exemplary microelectronic package of FIG. 1-3 though with squared-off vertical-z-like shaped wire bond wires.

FIG. 4-1 is a top-down perspective view illustratively depicting an exemplary microelectronic package having interference protection, as in FIG. 1-1, though with a triangularly shaped microelectronic device.

FIG. 4-2 is a cut-away diagram of the top-down perspective view illustratively depicting the exemplary microelectronic package of FIG. 4-1 after the addition of a molding layer and a triangular conductive layer.

FIG. 5 is a block diagram of the top-down perspective view illustratively depicting the exemplary microelectronic package after the addition of a molding layer and an oval conductive layer.

FIG. 6 is a block diagram of a cross-sectional view illustratively depicting an exemplary microelectronic package with inner and outer interference shielding cages.

FIG. 7-1 is a top-down perspective view illustratively depicting an exemplary microelectronic package having inner and outer interference protection.

FIG. 7-2 is the top-down perspective view illustratively depicting the exemplary microelectronic package of FIG. 7-1 after the addition of a conductive layer.

FIG. 7-3 is a cut-away diagram of the top-down perspective view illustratively depicting the exemplary microelectronic package of FIG. 7-1 after the addition of a molding layer and a conductive layer.

FIG. 9-1 is a top-down perspective view illustratively depicting an exemplary microelectronic package having inner and outer interference protection.

FIG. 9-2 is the top-down perspective view illustratively depicting the exemplary microelectronic package of FIG. 9-1 after the addition of a conductive layer.

FIG. 11 is a block diagram of a top-down view illustratively depicting an exemplary microelectronic package.

FIG. 12-1 is a block diagram of a cross-section along A1-A2 of FIG. 11.

FIG. 12-2 is a block diagram of a cross-section along A1-A2 of FIG. 11 after addition of a molding layer.

FIGS. 14-1 and 14-2 are block diagrams of a top-down view illustratively depicting respective exemplary wire bond wire patterns for neighboring EMI isolation regions.

FIGS. 15-1 through 15-3 are block diagrams of a side view illustratively depicting respective exemplary wire bond wire patterns for neighboring EMI isolation regions.

DETAILED DESCRIPTION

Figures 2, 3:
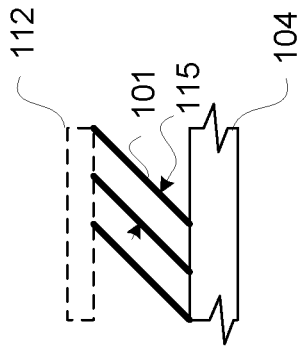

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Interference may be electromagnetic interference ("EMI"), including without limitation radio frequency interference ("RFI"), and/or another electrical and/or magnetic field that would produce undesirable EMI outside of the source generating the field. The following description of interference shielding may be used for EMI or other types of interference. EMI may be emitted from one device to another separate device, and compatibility of a device with respect to such out-of-package or out-of-device EMI emissions may be referred to as electromagnetic compatibility ("EMC"). For a device to have EMC, such a device may be precluded from emitting levels of EM energy sufficient to cause EMI harm in another device in an EMI environment of the EM emitting device. A common EMI emitting device is a mobile phone, and a mobile phone may have an EMC problem with respect to medical devices, which is a reason people are asked to turn-off their mobile phones in hospitals. For purposes of clarity by way of example and not limitation, generally only shielding from EMI is described below in additional detail; however, it shall become apparent from the following description that this shielding may also be used to enhance EMC. Along those lines, it will be appreciated that the following description is applicable to thin profile devices, such as mobile phones, wearables and/or Internet of Things devices, for reducing EM emission therefrom, and in some implementations enhancing EMC.

With the above general understanding borne in mind, various configurations for protection from interference are generally described below.

Along those lines, an apparatus generally relates to protection from electromagnetic ("EM") interference. In such an apparatus, a platform has an upper surface and a lower surface opposite the upper surface and has a ground plane. A microelectronic device is coupled to the upper surface of the platform. Wire bond wires are coupled to the ground plane. The wire bond wires have a pitch. The wire bond wires extend away from the upper surface of the platform with upper ends of the wire bond wires extending above an upper surface of the microelectronic device. The wire bond wires are spaced apart from one another to provide a fence-like perimeter to provide an interference shielding cage. A conductive layer is coupled to at least a subset of the upper ends of the wire bond wires for electrical conductivity to provide a conductive shielding layer to cover the interference shielding cage. To achieve enhanced suppression of EMI, spacings between each pair of adjacent wire bond wires may be substantially smaller than electrical wavelengths of interest, including without limitation the electrical wavelength of the highest operation frequency of interest. Along those lines, spacing between two adjacent wires can be less than approximately one tenth of the electromagnetic wavelength in a medium. For example, in a microelectronic package with conventional dielectric materials, the spacing between two adjacent wires can be less than 500 microns ("um") for an operational frequency of approximately 3 GHz, and less than 50 um for an operational frequency of approximately 30 GHz.

In the apparatus in the immediately preceding paragraph, the microelectronic device can be shielded from the interference outside of the interference shielding cage. The microelectronic device can be shielded by the interference shielding cage to reduce spread of the interference generated by the microelectronic device. The interference can be electromagnetic interference. The conductive layer can have an overhang extending beyond the perimeter. At least a subset of the wire bond wires can have gaps therebetween narrower than the pitch of at least the subset of the wire bond wires. The wire bond wires can have a /-like shape. The wire bond wires can have a ╰-like shape. The wire bond wires can have a ⌐-like shape. The perimeter can have a shape corresponding to a layout of the microelectronic device. The perimeter can have a contour or non-parallel sides shape. The perimeter can have a circular shape. The microelectronic device can be a first microelectronic device, and the apparatus can further include a second microelectronic device coupled to the platform and located outside of the interference shielding cage. The platform can be selected from a leadframe, a circuit board, a substrate, and a redistribution layer. The wire bond wires having the pitch can be first wire bond wires having a first pitch, the interference shielding cage can be a first interference shielding cage having a first perimeter, and the conductive layer can be a first conductive layer; and the apparatus can further include: second wire bond wires coupled to the ground plane with a second pitch, with the second wire bond wires extending away from the upper surface of the platform with upper ends of the second wire bond wires being above an upper surface of the second microelectronic device and the upper ends of the first wire bond wires; the second wire bond wires can be spaced apart from one another to provide a second fence-like perimeter to provide a second interference shielding cage, with the first perimeter being within the second perimeter; and a second conductive layer can be coupled to at least a subset of the upper ends of the second wire bond wires for electrical conductivity to at least provide a shield cover over the first interference shielding cage and the second interference shielding cage including overlapping the first conductive layer for having the first interference shielding cage within the second interference shielding cage. The wire bond wires having the pitch can be first wire bond wires having a first pitch, and the interference shielding cage can be a first interference shielding cage having a first perimeter; and the apparatus can further include: second wire bond wires coupled to the ground plane with a second pitch, with the second wire bond wires extending away from the upper surface of the platform with upper ends of the second wire bond wires being above an upper surface of the second microelectronic device and at a same level as the upper ends of at least the subset of the first wire bond wires; the second wire bond wires can be spaced apart from one another to provide a second fence-like perimeter to provide a second interference shielding cage with the first perimeter being within the second perimeter; and the conductive layer can be coupled to at least a subset of the upper ends of the second wire bond wires for electrical conductivity to at least provide a shield cover over the second interference shielding cage. The first microelectronic device can be coupled to the second microelectronic device though a gap in the interference shielding cage. The first microelectronic device can be a stronger electromagnetic interference source than the second microelectronic device. The wire bond wires having the pitch can be first wire bond wires having a first pitch, and the interference shielding cage can be a first interference shielding cage having a first perimeter; and the apparatus can further include: second wire bond wires coupled to the ground plane with a second pitch wider than the first pitch to provide a second interference for providing a portion of a second interference shielding cage having less shielding against interference than the first interference shielding cage. The conductive layer can define a ring-like hole therein having a pad therein isolated from a remainder of the conductive layer by the ring-like hole. The conductive layer can be a ground plane. The pad can be a signal pad or a power pad. The wire bond wires having the pitch can be first wire bond wires having a first pitch, and the interference shielding cage can be a first interference shielding cage having a first perimeter; and the apparatus can further include: second wire bond wires coupled to the ground plane with a second pitch with the second wire bond wires extending away from the upper surface of the platform with upper ends of the second wire bond wires being above an upper surface of the second microelectronic device and at a same level as the upper ends of at least the subset of the first wire bond wires; the second wire bond wires can be spaced apart from one another to provide a second fence-like perimeter in combination with a portion of the first wire bond wires to provide a second interference shielding cage with the first perimeter bordering the second perimeter; and the conductive layer can be coupled to at least a subset of the upper ends of the second wire bond wires for electrical conductivity to at least provide a shield cover over the second interference shielding cage.

A method relates generally to protection from EM interference. In such a method, a platform is obtained having an upper surface and a lower surface opposite the upper surface and having a ground plane. A microelectronic device is coupled to the upper surface of the platform. Wire bond wires are bonded to the ground plane, where the wire bond wires have a pitch. The wire bond wires extend away from the upper surface of the platform with upper ends of the wire bond wires being above an upper surface of the microelectronic device. The wire bond wires are spaced apart from one another to provide a fence-like perimeter to provide an interference shielding cage. A molding layer is deposited over the upper surface of the platform. A conductive layer is formed for coupling to at least a subset of the upper ends of the wire bond wires to provide a conductive shielding layer for electrical conductivity to cover the interference shielding cage.

Other features will be recognized from consideration of the description and claims, which follow.

Figures 2, 3, 4, 5, 6:
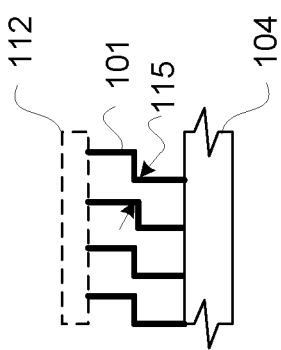
Figure 2:
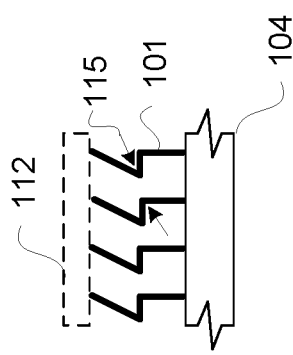
Figures 2, 3, 4, 5:
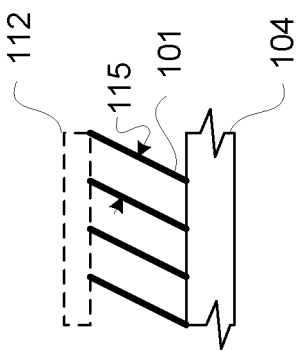
Figures 2, 3, 4, 5, 6, 7:
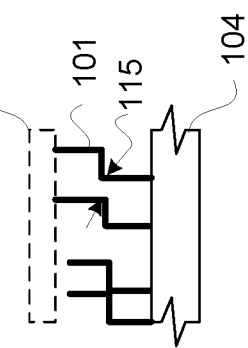
Figures 1, 2:
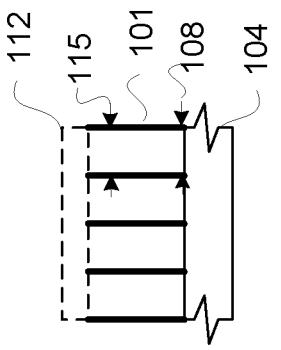
Figures 2, 3, 4:
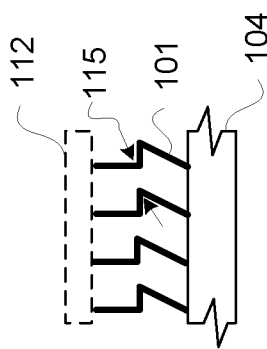
Figures 2, 3:
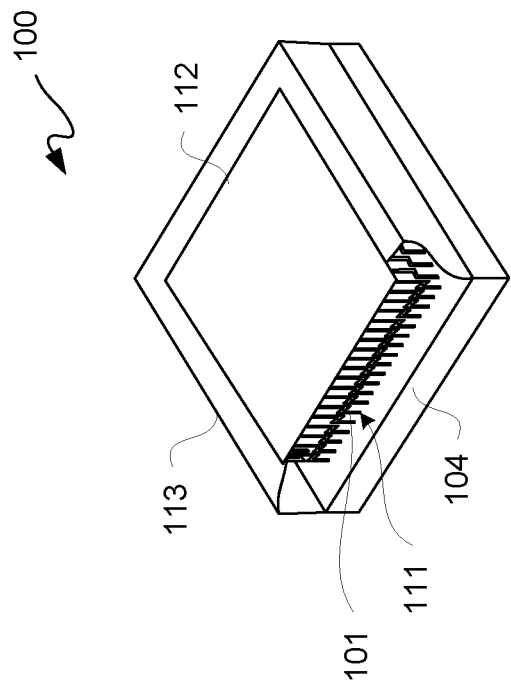
Figures 1, 3:
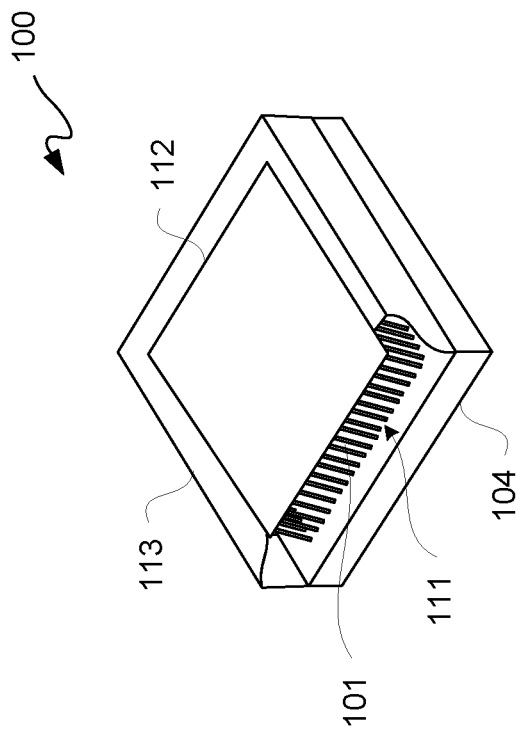
Figures 1, 2, 7:
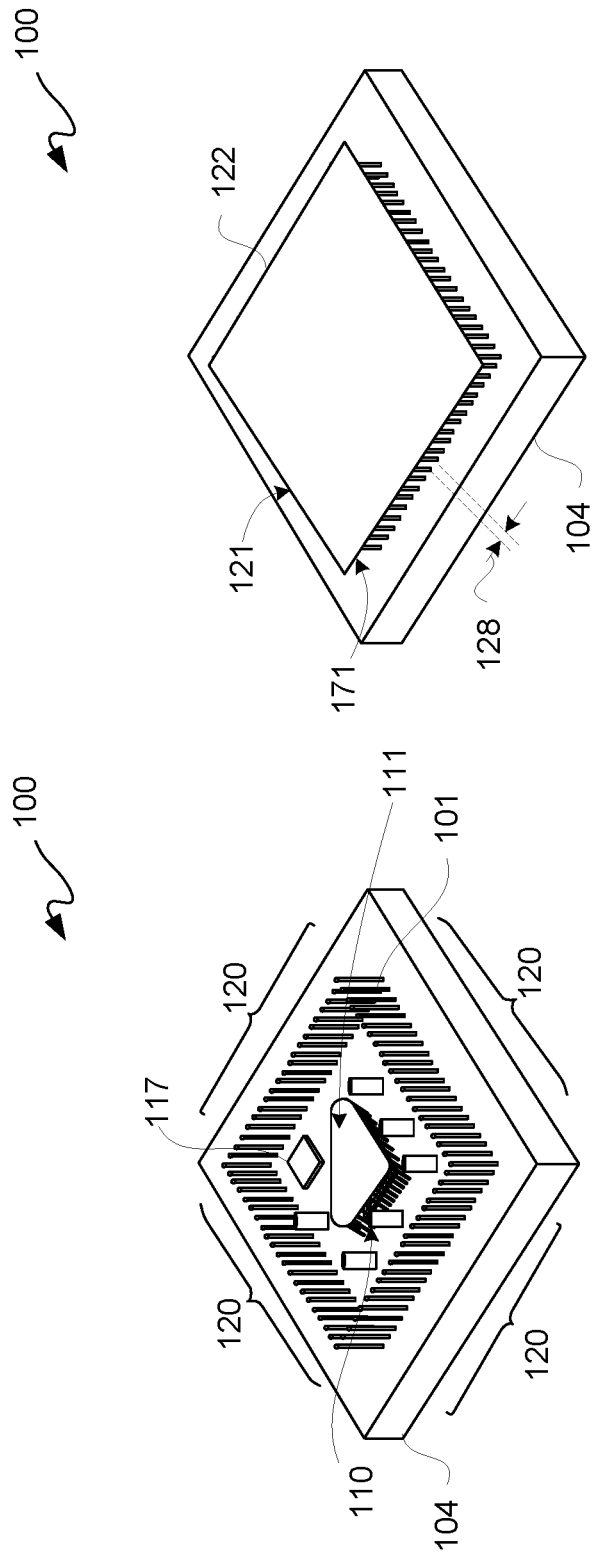
Figures 3, 7:
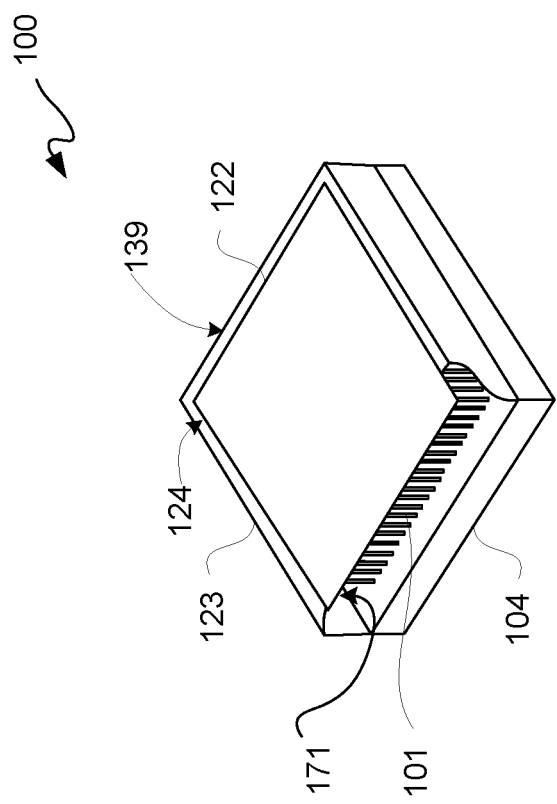

FIG. 1-1 is a top-down perspective view illustratively depicting an exemplary microelectronic package 100 having interference protection. FIG. 1-2 is the top-down perspective view illustratively depicting the exemplary microelectronic package 100 of FIG. 1-1 after the addition of a conductive layer 112. With simultaneous reference to FIGS. 1-1 and 1-2, microelectronic package 100 is further described.

In microelectronic package 100, a platform 104 has an upper surface 102 and a lower surface 106 opposite upper surface 102. Platform 104 further includes a ground plane 107, which in this example is subsurface with respect to upper surface 102, with surface accessible bond pads (not shown in this figure for purposes of clarity and not limitation) coupled to such ground plane 107. Platform 104 may be selected from a leadframe, a circuit board, a redistribution layer, a substrate, or other circuit base.

A microelectronic device 105 may be coupled to other bond pads (not shown in this figure for purposes of clarity and not limitation) on upper surface 102 of platform 104. Microelectronic device 105 for example may be an integrated circuit die, such as a resonator for example, or any other microelectronic component that generates EMI noise. Wire bond wires 101 may be coupled to ground plane 107 with a pitch 108. Wire bond wires 101 extend away from upper surface 102 of platform 104 with upper ends 103 of wire bond wires 101 being above an upper surface 109 of microelectronic device 105. For purposes of clarity by way of example and not limitation, wire bond wires 101 may have a height of approximately 0.4 mm and a diameter of 20 microns, with a pitch of approximately 80 microns. Distance between a wire bond wire 101 used to provide a perimeter for shielding and a microelectronic device 105 may be approximately 0.5 mm. An interference shielding cage in accordance therewith may provide approximately 30 to 33 dB of EMI suppression at maximum radiation direction for a frequency in a range of approximately 3.0 to 4.5 GHz with E-field radiation and radiation power both reduced by approximately over 97 percent or higher. By implementing EMI shielding as described herein, applications with operating frequencies of 5 GHz or greater frequencies may be have EMI suppression as described herein, including without limitation EMC enhancement. However, these or other parameter details to provide EMI shielding may be used as may vary from application-to-application.

Wire bond wires 101 are spaced apart from one another to provide a picket fence-like wall or perimeter 110. Such a picket-fence like or bars on a cage-like perimeter of wire bond wires 101 may be used to provide an interference shielding wall for an interference shielding cage 111, such as a bond via array ("BVA") cage. Interference shielding cage 111 further includes a conductive layer 112 having a lower surface. Such lower surface of conductive layer 112 may be mechanically coupled, such as by applying solder or other eutectic masses to at least a subset, if not all, of upper ends 103 of wire bond wires 101 to provide attachment of a conductive shielding layer for electrical conductivity to cover interference shielding cage 111. Conductive surface 112 in this example is a sheet material, which may be used to provide an EMI shield cap or cover of an interference shielding cage 111. However, in another implementation, a mesh of material may be deposited for use as a shield cover of an interference shielding cage 111.

FIG. 1-3 is a cut-away diagram of the top-down perspective view illustratively depicting the exemplary microelectronic package 100 of FIG. 1-1 after the addition of a molding layer 113 and a conductive layer 112. In this optional implementation, after forming molding layer 113 over upper surface 102 and around bases and shafts of wire bond wires 101, at least a subset, if not all, of upper ends 103 of wire bond wires 101 may be temporarily exposed above an upper surface 114 of molding layer 113. A mold assist film (removed in this figure) may be used in an injection mold for example to have upper ends 103 available for mechanical or other coupling. In this implementation, upper ends of wire bond wires 101 do not have to be exposed by back grinding, planarizing, etching back, polishing or otherwise from molding layer 113.

Along those lines, conductive layer 112 may be mechanically coupled as previously described. However, optionally conductive layer 112 may be formed by spraying, sputtering, printing, painting, ink stamping, or otherwise forming a conductive shielding layer on upper surface 114 for interconnect with upper ends 103. By forming conductive layer 112 by spraying, sputtering, printing, painting, ink stamping, or otherwise depositing a conductive material, conductive layer 112 may be selectively applied. Along those lines, a mesh or solid surface, or a combination of part mesh and part solid surface, for conductive layer 112 may be formed.

For purposes of clarity, conductive layer 112 is illustratively depicted as extending toward a front edge 139 of microelectronic package 100 and covering only a portion of an upper surface 114 of molding layer 113. However, in another implementation, conductive layer 112 may extend to none, or one or more edges 139 of microelectronic package 100. Along those lines, FIG. 1-4 is a block diagram of the top-down perspective view illustratively depicting the exemplary microelectronic package 100 of FIG. 1-1 after the addition of a molding layer 113 and a conductive layer 112, where conductive layer 112 covers an upper surface of microelectronic package 100.

In this example, there are four edges 139 to which conductive layer 112 extends; however, conductive layer 112 may be formed to cover an upper surface area of any shape of a microelectronic package 100. By having conductive layer 112 overhang or otherwise extend beyond a perimeter 110 formed by wire bond wires 101 associated with an interference shielding cage 111, EMI shielding may be enhanced over a corresponding interference shielding cage 111 where conductive layer 112 does not extend beyond perimeter 110 formed of wire bond wires 101. For minimally effective EMI shielding, such an overhang or extension may be approximately minimally half of the vertical or perpendicular height ("H") of wire bond wires 101. Thus, a perimeter of conductive layer 112 may be greater than a surface area associated with a perimeter 110 of wire bond wires 101 of an interference shielding cage 111 minimally by ½H in each direction toward one or more edges 139. Though a ½H overhang can reduce EMI emissions, such as of an evanescent or standing wave, a larger overhang may suppress EMI emission further, as EMI emission may include both radial emission and an evanescent wave. Based on electromagnetic wave theory, only the lowest transverse electric (TE) mode is propagation wave, other higher order modes are evanescent waves that decay to negligible small after propagating distance of perpendicular height H. Thus, an overhang of H can significantly further suppress the EMI radiation. Along those lines, an overhang for extending conductive layer 112 beyond perimeter 110 in each direction by approximately H may be used. Thus, conductive layer 112 may be extended to all edges 139 of a package part for an overhang of H or greater beyond perimeter 110 in all directions toward edges 139.

In any of the above configurations, microelectronic device 105 may be shielded from interference outside of interference shielding cage 111, such as outside of a perimeter 110 of wire bond wires 101. However, for purposes of clarity by way of example and not limitation, it shall be assumed that during operation microelectronic device 105 is an EMI generator. Along those lines, microelectronic device 105 may be shielded by interference shielding cage 111, such as by perimeter 110 of wire bond wires 101, to reduce or prevent spread of EMI, namely size of an EM environment, generated by microelectronic device 105. For example, interference generated by microelectronic device 105 without interference shielding cage 111 may generate an EMI environment affecting EMC. For purposes of clarity by way of example and not limitation, it shall be assumed that microelectronic device 105 is an RF component. Microelectronic device 105 may be a stacked die, such as a 3D IC or may be shielded from such a stacked die.

FIGS. 2-1 through 2-7 are respective block diagrams of side views illustratively depicting exemplary profiles of wire bond wires 101. In FIG. 2-1, wire bond wires 101 have a generally vertical profile, such as previously described. Along those lines, gaps between such generally vertical profile wire bond wires 101 may have a generally consistent pitch 108, where such wire bond wires 101 are bonded for example to platform 104, and closest spaces or gaps 115 between such wires moving up from such platform 104 may be generally a consistent spacing or gapping. Routing wiring, such as signal, power, or ground traces for microelectronic package 100 may extend through one or more gaps between adjacent wire bond wires 101. Thus, wiring layers (not shown) may include routing on upper surface 102 of platform 104 without interfering with corresponding EMI shielding, thereby simplifying routing over traditional "can" style EMI shielding mechanisms, which would experience an electrical short if the solid conductive surface contacted surface routing.

For FIGS. 2-2 through 2-7, the closest spacings of gaps 115 may be narrower than pitch 108. By "pitch", it is generally meant a predetermined center-to-center spacing between bases of wire bond wires, which may be contrast for example from slant of such wire bond wires. Along those lines, at least a subset, if not all, of wire bond wires 101 may have gaps 115 therebetween narrower than a corresponding pitch 108 of at least a subset of wire bond wires 101. Wire bond wires 101 may have a slash-like or "I" shape or profile, such as in FIGS. 2-2 and 2-6. In FIG. 2-3, wire bond wires 101 have a squared-off vertical-z-like, or a kinked or rounded shaped profile. Of course, the wires shown by way of example in FIGS. 2-1 through 2-7 may have additional bends not shown in the schematic drawings. For instance, the "/" shaped wires may have portions that do not have a straight line profile and instead have slightly more vertical or horizontal portions at either end due to tooling parameters. Thus, the wire may have be considered to have an imaginary axis extending from one end of the wire to the other with portions of the wire bond extending outside of that axis in the x, y, and/or z directions.

In FIGS. 2-4 and 2-5 wire bond wires may have a vertical partial four-like shape or profile. Other shapes, such as chevron ("<" or ">" shapes), arc ("("or")" shapes), or coil shaped configurations are optional. Even though non-curved angles and/or segments are illustratively depicted, in other implementations, such angles and/or segments may have curves, such as for example a curved-el-like profile shape. Moreover, wire bond wires 101 may be loops, such as having an open loop omega-like "Ω" shaped profile or a closed loop el-like " $\ell$ " shaped profile. The wire loops may each be formed on a single pad and may be offset or angled relative to each other in the x and y direction (i.e., in a layout similar to "\ \ \" when viewed down the z direction) to facilitate a more tightly packed layout than might be possible if the wires in the wire loop extended in the same plane (i.e., in a layout similar to "_ _ _" when viewed down the z direction).

FIG. 3-1 is the exemplary microelectronic package 100 though with slash-like shaped wire bond wires 101, and FIG. 3-2 is the exemplary microelectronic package 100 though with squared-off vertical-z-like shaped wire bond wires 101. Along those lines, pitch, shape, and diameter of wire bond wires 101, including without limitation irregularly shaped wire bond wires 101, may be used to further reduce EM emissions from a fence-like perimeter, such as perimeter 110 for example, formed of wire bond wires 101. Some of adjacent wire bond wires 101 may be in contact with each other, and some wires 101 may not extend to conductive layer 112, such as illustrative depicted in FIG. 2-7 for purposes of clarity by way of example and not limitation, and these or other options described herein may be selectable by a designer for a given EMI shield design or characteristic.

As above with reference to FIG. 1-1, perimeter 110 formed by layout of wire bond wires 101 may have a shape corresponding to a layout of microelectronic device 105. However, microelectronic device 105 may have a layout shape other than that of a square, rectangle or other similar polygon. Moreover, microelectronic device 105 may have a layout shape of a circle, oval or other curvilinear shape. Shaping fence-like perimeters, such as for example perimeter 110 and/or below described perimeter 120, formed of wire bond wires 101 to a microelectronic device 105 layout shape or footprint may be used to provide more compact designs and/or better shielding performance than not contouring fence-like perimeters to such footprint.

FIG. 4-1 is a top-down perspective view illustratively depicting an exemplary microelectronic package 100 having interference protection, as in FIG. 1-1, though with a triangularly shaped microelectronic device 105. Correspondingly, perimeter 110 formed of wire bond wires 101 may have a corresponding triangular shape. In this example, wire bond wires 101 have a slash-like profile. FIG. 4-2 is a cut-away diagram of the top-down perspective view illustratively depicting the exemplary microelectronic package 100 of FIG. 4-1 after the addition of a molding layer 113 and a triangular conductive layer 112. Accordingly, more generally, a perimeter may have one or more contoured sides, non-parallel sides and/or non-orthogonal sides in order to follow a layout of an irregularly shaped microelectronic device 105.

FIG. 5 is a block diagram of the top-down perspective view illustratively depicting the exemplary microelectronic package 100 after the addition of a molding layer 113 and a conductive layer 112. Circles 116 generally indicate upper ends of wire bond wires 101 positioned for providing an oval shaped perimeter 110 of wire bond wires 101, as previously described though for an oval shaped microelectronic device 105. Microelectronic devices 105 as described herein may be passive or active devices. Conductive layer 112 may have an oval shape as generally indicated by dashed oval 112A. However, conductive layer 112 may overhang an oval shaped perimeter 110 and need not be contoured like perimeter 110. Thus, for example, conductive layer 112 may extend to edges of a package, as generally indicated by arrow 112B. Moreover, in another implementation, conductive layer 112 may have an oval shape to extend beyond perimeter 110, as generally indicated by dashed oval 112C.

FIG. 6 is a block diagram of a cross-sectional view illustratively depicting an exemplary microelectronic package 100 with inner and outer interference shielding cages 111 and 121, respectively. In this example, inner interference shielding cage 111 has therein a microelectronic device 105 surrounded by a perimeter of wire bond wires 101, where location of a conductive layer 112 is generally indicated with a dashed line bridging such wire bond wires 101, such as previously described for example. In this example, conductive layer 112 of inner interference shielding cage 111 does not overhang or extend beyond an inner perimeter formed of wire bond wires 101.

An outer interference shielding cage 121 has one or more microelectronic devices 117, as well as inner interference shielding cage 111, therein. One or more of microelectronic devices 117 may be taller than microelectronic device 105. In other words, an upper surface of such one or more taller microelectronic devices 117 may be above, though not necessarily overlapping, an upper surface of microelectronic device 105.

Microelectronic devices 117 may be coupled to an upper surface of platform 104 and may be located outside of inner interference shielding cage 111. In this example, inner interference shielding cage 111 is surrounded by a perimeter of wire bond wires 101 of outer interference shielding cage 121. For outer interference shielding cage 121, location of a conductive layer 122 therefor is generally indicated with a dashed line bridging such wire bond wires 101, such as previously described with reference to conductive layer 112 for example, as well as extending beyond an outer perimeter of wire bond wires 101 of outer interference shielding cage 121.

Having both inner and outer interference shielding cages 111 and 121 within a same plot may be used for different types or levels of interference noise, such as EMI and EMC for example, as well as more or less compact and/or complex shielding implementations as described elsewhere herein. Along those lines, an overhang or eave 171 may extend beyond each side of a perimeter of wire bond wires 101 of outer interference shielding cage 121 by approximately a distance H, for H also a vertical height of wire bond wires 101 used to provide such a perimeter.

FIG. 7-1 is a top-down perspective view illustratively depicting an exemplary microelectronic package 100 having inner and outer interference protection. FIG. 7-2 is the top-down perspective view illustratively depicting the exemplary microelectronic package 100 of FIG. 7-1 after the addition of conductive layer 122. With simultaneous reference to FIGS. 1-1 through 7-2, microelectronic package 100 of FIGS. 7-1 and 7-2 is further described. As much of the above description is applicable to describing microelectronic package 100 of FIGS. 7-1 and 7-2, some of such description is not repeated for purposes of clarity and not limitation.

Inner perimeter wire bond wires 101 may have a pitch 108 for an inner interference shielding cage 111 having a conductive layer 112. Conductive layer 112 may not have sufficient room for an overhang. Outer wire bond wires 101 may be coupled to a ground plane 107 though with a same or different pitch 128 with reference to pitch 108. Outer wire bond wires 101 extend away from an upper surface of platform 104 with upper ends 103 of outer wire bond wires 101 being above an uppermost upper surface of microelectronic devices 117, as well as above upper ends of inner wire bond wires 101 and inner conductive layer 112.

Outer wire bond wires 101 may be spaced apart from one another to provide an outer picket fence-like perimeter 120 to provide an outer interference shielding cage 121. Inner perimeter 110 may be completely within outer perimeter 120.

An upper conductive layer 122 may be coupled to at least a subset of upper ends 103 of outer wire bond wires 101 for electrical conductivity to cover inner interference shielding cage 111 and outer interference shielding cage 121, where upper conductive layer 122 is above and overlapping inner-lower conductive layer 112 for having inner interference shielding cage 111 within outer interference shielding cage 121. Outer interference shielding cage 121 may be for EMC shielding, whereas inner interference shielding cage 111 may be for EMI shielding. Along those lines, conductive layer 122 may extend beyond perimeter 120 to provide an overhang 171, of at least approximately ½H in order to enhance EMC, and overhangs greater than ½H, such as an overhang of at least H may provide more EMI evanescent wave suppression.

Even though a mechanical coupling is illustratively depicted in FIG. 7-2, such coupling of conductive layer 122 may be after forming another molding layer over molding layer 113. FIG. 7-3 is a cut-away diagram of the top-down perspective view illustratively depicting the exemplary microelectronic package 100 of FIG. 7-1 after the addition of a molding layer 123 and a conductive layer 122. In this optional implementation, after forming molding layer 123 over conductive layer 112 and molding layer 113, at least a subset, if not all, of upper ends 103 of outer wire bond wires 101 may be temporarily exposed above an upper surface 124 of molding layer 123. A mold assist film (removed in this figure) may be used in an injection mold for example to have upper ends 103 of outer wire bond wires 101 available for mechanical or other coupling.

Along those lines, conductive layer 122 may be mechanically coupled as previously described. However, optionally conductive layer 122 may be formed by spraying, sputtering, printing, painting, ink stamping, or otherwise forming a conductive shielding layer on upper surface 124 for interconnect with upper ends 103 of outer wire bond wires 101. Conductive layer 122 may provide an overhang 171, which may or may not extend to outer edges 139 of microelectronic package 100. Conductive layer 122 is illustratively depicted as being short of outer edges 139 in order to more clearly indicate a perimeter of conductive layer 122.

Figure 8:
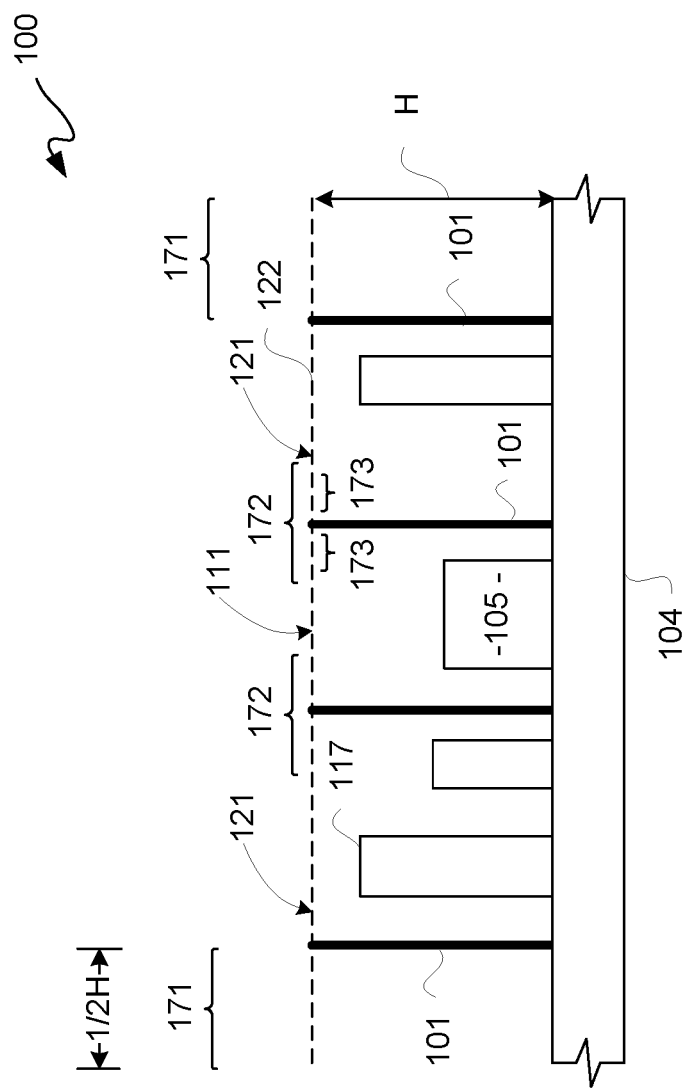
FIG. 8 is a block diagram of a cross-sectional view illustratively depicting an exemplary microelectronic package with inner and outer interference shielding cages.

FIG. 8 is a block diagram of a cross-sectional view illustratively depicting an exemplary microelectronic package 100 with inner and outer interference shielding cages 111 and 121, respectively. In this example, inner interference shielding cage 111 has therein a microelectronic device 105 surrounded by a perimeter of wire bond wires 101, where location of a conductive layer 122 is generally indicated with a dashed line bridging such wire bond wires 101. In this example, conductive layer 122 provides a common cover for both of inner interference shielding cages 111 and 121 and also provides an overhang 171 to extend beyond an outer perimeter formed of wire bond wires 101 by approximately ½H.

An outer interference shielding cage 121 has one or more microelectronic devices 117, as well as inner interference shielding cage 111, therein. One or more of microelectronic devices 117 may be taller than microelectronic device 105. In other words, an upper surface of such one or more taller microelectronic devices 117 may be above, though not necessarily overlapping, an upper surface of microelectronic device 105.

Microelectronic devices 117 may be coupled to an upper surface of platform 104 and may be located outside of a perimeter of inner interference shielding cage 111. In this example, inner interference shielding cage 111 is surrounded by a perimeter of wire bond wires 101 of outer interference shielding cage 121. Location of a conductive layer 122 is generally indicated with a dashed line bridging wire bond wires 101 for both inner interference shielding cage 111 and outer interference shielding cage 121, namely being an EMI shielding cover common to both of cages 111 and 121 without having a separate cover for inner interference shielding cage 111. Conductive layer 122 extends beyond an outer perimeter of wire bond wires 101 of outer interference shielding cages 121. Having both inner and outer interference shielding cages 111 and 121 within a same plot may be used for different types or levels of interference noise, such as EMI and EMC for example, as well as more compact and less complex shielding implementations. Along those lines, an overhang or eave 171 may extend beyond each side of a perimeter of wire bond wires 101 of each outer interference shielding cage 121 by approximately at least a distance ½H, for H also a vertical height of wire bond wires 101 used to provide such a perimeter. Effectively, because a common conductive layer 122 is used for both outer interference shielding cages 121 and inner interference shielding cage 111, common sections 172 provide overhangs 173 for EMI shielding, such as for EMI suppression of higher order modes and evanescent waves.

Figures 1, 2, 9:
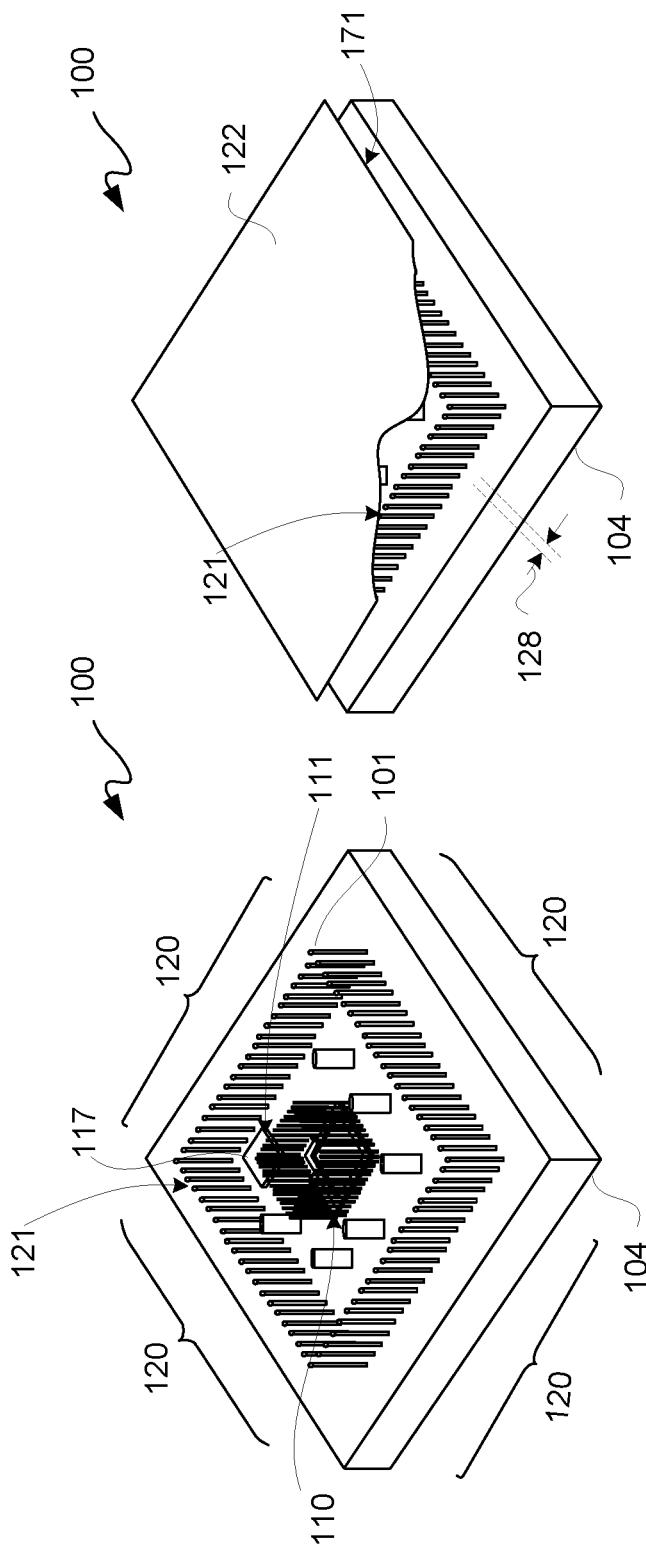

FIG. 9-1 is a top-down perspective view illustratively depicting an exemplary microelectronic package 100 having inner and outer interference protection. FIG. 9-2 is the top-down cutaway perspective view illustratively depicting the exemplary microelectronic package 100 of FIG. 9-1 after the addition of conductive layer 122. With simultaneous reference to FIGS. 1-1 through 9-2, microelectronic package 100 of FIGS. 9-1 and 9-2 is further described. As much of the above description is applicable to describing microelectronic package 100 of FIGS. 9-1 and 9-2, some of such description is not repeated for purposes of clarity and not limitation.

Inner perimeter wire bond wires 101 may have a pitch 108 for an inner interference shielding cage 111 having a separate conductive layer 112 independent of another interference shielding cage or having a common conductive layer 122 for a common cover with another interference shielding cage. Outer wire bond wires 101 of outer interference shielding cage 121 may be coupled to a ground plane 107, though with a same or different pitch 128 with reference to pitch 108 as inner wire bond wires 101 of inner interference shielding cage 111. Outer wire bond wires 101 coupled to ground plane 107 with a pitch 128 wider than pitch 108 may be for EMC for providing an outer interference shielding cage 121 having less shielding against EMI than inner interference shielding cage 111. Conductive layer 122 may have an overhang 171 extending beyond a perimeter 120 of outer wire bond wires 101 for enhancing EMC.

Outer wire bond wires 101 extend away from an upper surface of platform 104 with upper ends 103 of outer wire bond wires 101 being above an uppermost upper surface of microelectronic devices 117, but at a same level as upper ends of at least a subset, if not all, of inner wire bond wires 101 with no inner conductive layer 112.

Outer wire bond wires 101 may be spaced apart from one another to provide an outer picket fence-like perimeter 120 to provide an outer interference shielding cage 121. Inner perimeter 110 may be completely within outer perimeter 120.

A conductive layer 122 may be mechanically coupled to at least subsets of upper ends 103 of both inner and outer wire bond wires 101 for electrical conductivity to cover inner interference shielding cage 111 and outer interference shielding cage 121, where conductive layer 122 is above and overlapping inner interference shielding cage 111 within outer interference shielding cage 121. Outer interference shielding cage 121 may be for EMI and/or EMC shielding, and inner interference shielding cage 111 may be for EMI shielding, with a single conductive layer 122 for providing a ceiling for both inner and outer interference shielding cages.

Again, even though a mechanical coupling is illustratively depicted in FIG. 9-2, such coupling of conductive layer 122 may be after forming another molding layer 123 over molding layer 113, as previously described.

Even though concentric inner and outer perimeters 110 and 120 of wire bond wires 101 has been described for forming inner and outer interference shielding cages 111 and 121, respectively, a microelectronic package 100 may include multiple types of interference shielding cages in accordance with the description herein.

Figure 10:
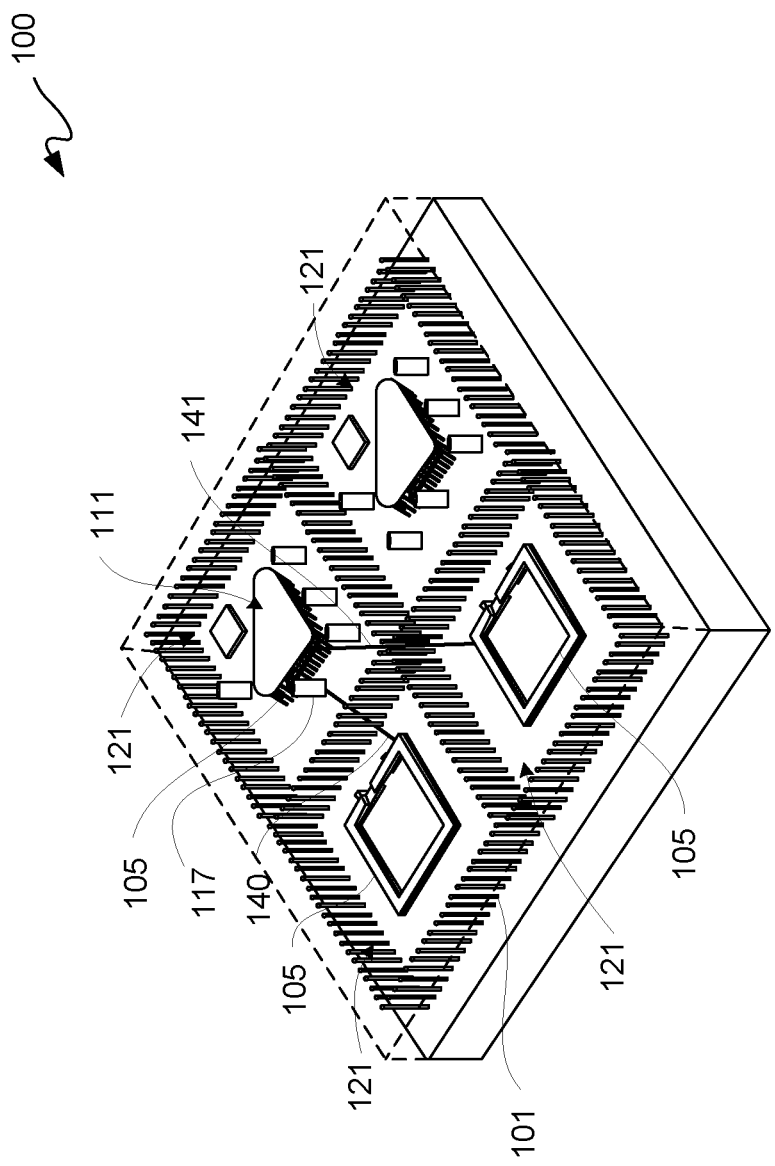
FIG. 10 is a top-down perspective view illustratively depicting an exemplary microelectronic package having plots for interference shielding cages as in FIG. 1-1 and as in FIG. 7-1 for example.

Along those lines, FIG. 10 is a top-down perspective view illustratively depicting an exemplary microelectronic package 100 having plots for interference shielding cages as in FIG. 1-1 and as in FIG. 7-1 for example. With simultaneous reference to FIGS. 1-1 through 10, microelectronic package 100 of FIG. 10 is further described, while much of the above description which is the same is not repeated for purposes of clarity and not limitation.

Though four plots with both one and two interference shielding cages are illustratively depicted, other combinations of plots as described herein may be implemented in other configurations of microelectronic package 100. In this configuration, wire bond wires 101 forming one or more picket fence-like perimeters 110 and/or 120 of one plot may be adjacent another picket fence-like outer perimeter 110 or 120. Thus, a portion of one picket fence-like perimeter may be used in combination with a portion of a neighboring or bordering picket fence-like perimeter to provide an interference shielding cage. Along those lines, a multiplex of interference shielding cages 121, with or without one or more inner interference shielding cages 111, may be provided with a single microelectronic package 100. Inner perimeters 110 of these interference shield cages 111 provided by wire bond wires 101 may, but do not need to, run perpendicular to an edge or follow a straight line. Rather, such inner perimeters can be laid out or shaped to follow a contour or other irregular pattern. Conductive layer 122, which is left off for clarity in FIG. 10, may be formed over multiple outer interference shielding cages 121, as previously described herein.

A microelectronic device 105 in an inner or only interference shielding cage 111 or a microelectronic device 117 in an outer interference shielding cage 121 of a plot may be coupled to another microelectronic device 105 or 117 in another interference shielding cage 111 or 121 in another plot by routing between pairs of adjacent wire bond wires 101 in one or more intervening perimeters 110 and/or 120, such as routings 140 and 141 for example. By coupling microelectronic devices between one or more gaps in one or more interference shielding cages, a microelectronic device which is a stronger EMI source, such as a signal pad without grounding, than another microelectronic device, such as a ground pad which may not be caged, may be directly coupled to one another while still providing sufficient EMI shielding to such stronger EMI source. This may be used for more compact designs with fewer fences to provide sufficient shielding.

Furthermore, it should be understood that one interference shielding cage 121 may directly border, space apart or not, another interference shielding cage 121 without having to provide isolation gaps, such as in a molding layer for example, for electrical isolation between such neighboring interference shielding cages. By routing through fences of cages as described herein, routing may be at lower levels, rather than having to run such routing over on top of a microelectronic package. In conventional isolation, trenches are formed which can significantly increase topside routing complexity, and this complexity may be significantly reduced with routing through cage fences, in addition to not having EMI isolation trenches. Moreover, wire bond wires 101 may be shared among such neighboring interference shielding cages, as previously described. Accordingly, either or both of these configurations may be used to provide a more densely populated microelectronic package 100, namely a microelectronic package that has a smaller footprint.

FIG. 11 is a block diagram of a top-down view illustratively depicting an exemplary microelectronic package 100, and FIG. 12-1 is a block diagram of a cross-section along A1-A2 of FIG. 11. With simultaneous reference to FIGS. 1 through 12-1, microelectronic package 100 of FIGS. 11 and 12-1 is further described.

A conductive layer 112 or 122 may be a ground plane, which as a hole 160, such as a ring-like hole, cut or ablated therein, such as laser ablated for example, to define an electrical island or pad 161 therein, namely pad 161 is not in contact with, nor isolated from, a remainder of conductive layer 112 or 122. Pad 161 may be a signal pad or a power pad coupled to at least one wire bond wire 101C, not part of an interference shielding cage 111 or 121, located for interconnection with pad 161. Isolation of pad 161 may be used for system-in-package ("SiP") integration. As one example, a decoupling capacitor or other passive or active device may be coupled to one or more of such isolated pads 161. This implementation allows passive and/or active devices to be placed on a level above EMI shielding with interconnects through microelectronic package 100 formed at the same time as one or more interference shielding cages, thereby simplifying package processing. Of course, multiple pads 161 maybe formed singularly or in an array of two or more pads. Devices may be attached to one or more pads 161, conductive layer 112/122, or both, for an application. Moreover, while pad 161 is illustratively depicted as surrounded by a conductive layer, this is for illustrative purposes only. Conductive layer 112/122 may be generally adjacent to only one or more of the sides of contact pad 161.

FIG. 12-2 is a block diagram of a cross-section along A1-A2 of FIG. 11 after addition of a molding layer 113. With simultaneous reference to FIGS. 1 through 12-2, microelectronic package 100 of FIGS. 11 and 12-2 is further described. In another implementation, one or more pads 161 may be selectively formed on an upper surface of a molding layer 113. Along those lines, molding layer 113 may be a dielectric, and such one or more pads 161 may be electrically isolated from one another along an upper surface of molding layer 113. By forming conductive layer 112 by plating, spraying, sputtering, printing, painting, ink stamping, or otherwise selectively depositing a conductive material, conductive layer 112 may be selectively applied in any applicable pattern or design to an upper surface of molding layer 113.

Figure 13:
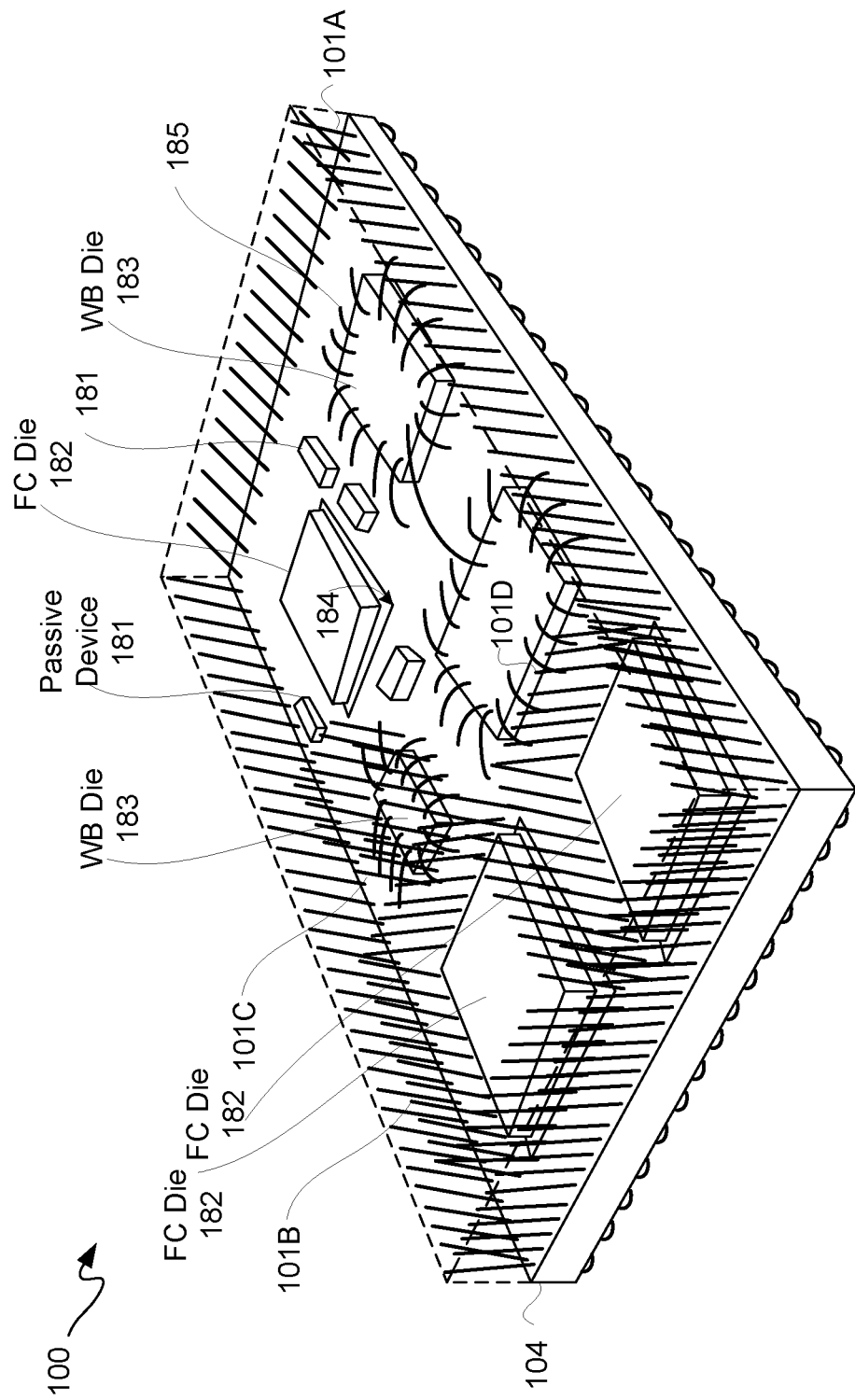
FIG. 13 is a top-down perspective view illustratively depicting an exemplary microelectronic package having interference shielding cages.

FIG. 13 is a top-down perspective view illustratively depicting an exemplary microelectronic package 100 having interference shielding cages, as described above. In this example, interference shielding cages may include multiple odd-shaped divisions or sections. Thus, there may be multiple isolation zones, which need not, though may, be orthogonal to one another. FIG. 13 is further described with simultaneous reference to FIGS. 1 through 13.

Along those lines, microelectronic package 100 may be a SiP having passive devices 181, flip-chip ("FC") dies 182, and wire bond ("WB") dies 183 all coupled to an upper surface 102 of a platform 104. WB dies 183 may be bonded to platform 104 with wire bonds 185. The wire bonds 185 and/or surface traces (not shown) on platform 104 may be configured to extend between adjacent wire bond wires 101A-101D to other die, or to pads located on the platform 104, on the other side of an EMI shielded area. In certain implementations, this allows the EMI shield wire bond wires 101A-101D to be formed closer to the EMI source or EMI protected device than the pad on the platform 104. This also allows for more routing flexibility through the sides of the EMI cage than would be possible through conventional techniques such as those EMI shields configured using either a solid conductive side surface or wire bond arches. Other interconnection techniques are shown in FIG. 13, such as FC dies 182 being "flip-chip" coupled to platform 104, along with having an underfill layer 184 for such coupling.

Wire bond wires 101B and 101D may form separate EMI shielding perimeters, such as perimeters 110 for example, around respective FC dies 182. Wire bond wires 101C may form a separate EMI shielding perimeter, such as a perimeter 110 for example, around a WB die 183. Wire bond wires 101A may form an EMI shielding perimeter, such as a perimeter 120 for example, around components coupled to upper surface 102 of platform 104 for EMI shielding to enhance EMC.

A SiP may be a number of active or/and passive components enclosed in a single IC package module, such as microelectronic package 100. SiPs are widely used in RF applications, including without limitation mobile devices, wearables and Internet of Things ("IoT") devices. For example, an RF SiP can contain some active chips such as one or more ASIC and/or memory chips, and some passive components such as RF resistors, capacitors, inductors, oscillators, etc. A SiP is particularly useful in space constrained environments, as a SiP significantly reduces complexity of a printed circuit board ("PCB") and system design. Recently, SiPs are attracting interest in small form factor electronics, including without limitation IoT devices.

It should be appreciated that issues of EMI and EMC may be more problematic in future SiP designs because more components with multiple frequencies may be integrated into a single RF SiP. For example, a SiP for 5G wireless devices may handle multiple RF functions including WiFi, 3G, 4G LTE, ZigBee, etc. However, by having the ability to selectively apply wire bond wire perimeters for EMI shielding, as previously described, EMI shielding may be provided for different domains within a same SiP. Wire bond wires 101 may be implemented with high-frequency wire bonding machines for cost effective and high volume production. Moreover, wire bond wires, whether ball bonded or wedge bonded, may be used to make good ground contacts without block surface signal routings between domains.

FIGS. 14-1 and 14-2 are block diagrams of a top-down view illustratively depicting respective exemplary wire bond wire patterns 191 and 192 for neighboring EMI isolation regions. With simultaneous reference to FIGS. 1 through 14-2, wire bond wire patterns 191 and 192 are further described. A row of wire bond wires 101B and a row of wire bond wires 101D may be back-to-back and spaced apart from one another. Having two or more rows of wire bond wires may be laid out to create concentric perimeters with an array of wires instead of lines of wire bond wires as illustratively depicted in the earlier figures, or a combination thereof.

In wire bond wire pattern 191, bases of wire bond wires 101B and 101D are horizontally- or vertically-aligned to one another, so gaps between wire bond wires 101B correspond to gaps between wire bond wires 101D. This arrangement or pattern may be useful for allowing direct surface routing to pass through fence-like EMI shield perimeters formed by wire bond wires 101B and 101D. In another implementation, wire bond wires 101B and/or 101D may include loop-like structures, such as open loop omega-like structures, as generally indicated with dashed lines 189.

In wire bond wire pattern 192, bases of wire bond wires 101B and 101D are offset-aligned to one another, so gaps between wire bond wires 101B correspond to bases of wire bond wires 101D, and gaps between wire bond wires 101D correspond to bases of wire bond wires 101B. This arrangement or pattern may be useful for having an overlapping and/or interspersing of wire bond wires with respect to EMI emissions to effectively provide a more dense mesh, for example by a combination of fence-like EMI shield perimeters formed by wire bond wires 101B and 101D.

Moreover, wire bond wires 101B and 101D may have same or different diameters, and may be made out of same or different materials. Pattern selection, as well as thickness and/or material selection, may be tailored to an application, such as may be associated with parameters of sources of EMI emission, including without limitation frequency of operation.

FIGS. 15-1 through 15-3 are block diagrams of a side view illustratively depicting respective exemplary wire bond wire patterns 193 and 194 for neighboring EMI isolation regions. With simultaneous reference to FIGS. 1 through 15-3, wire bond wire patterns 193 and 194 are further described. A row of wire bond wires 101B and a row of wire bond wires 101D may be back-to-back and spaced apart from one another, and both sets of these rows of wire bond wires may be slanted. Wire bond wires 101D are illustrated with dashed lines to indicate they are in back of wire bond wires 101B. An outer ring or other perimeter of an EMI cage may have wires slanted in one direction, while an inner ring or other perimeter of another EMI cage may be slanted in a second direction opposite the first direction. For example, such a second direction may be generally an opposite angle with respect to the angle in such a first direction in any of x, y, or z directions.

More particularly by way of non-limiting example, in left wire bond wire pattern 193, bases of wire bond wires 101B and 101D are horizontally- or vertically-aligned to one another, so gaps between wire bond wires 101B correspond to gaps between wire bond wires 101D. As mentioned above with reference to FIG. 10, this arrangement or pattern may be useful for allowing surface-based routing to pass through fence-like EMI shield perimeters formed by wire bond wires 101B and 101D. However, wire bond wires 101B and 101D are slanted in opposite directions in order to form a crosswise mesh for a combination of fence-like EMI shield perimeters formed by wire bond wires 101B and 101D.

Right wire bond pattern 193 is the same as left wire bond pattern, except bases of wire bond wires 101B and 101D are offset-aligned to one another, so gaps between wire bond wires 101B correspond to bases of wire bond wires 101D, and gaps between wire bond wires 101D correspond to bases of wire bond wires 101B. This arrangement or pattern may be useful for forming a bi-directional mesh for a combination of fence-like EMI shield perimeters formed by wire bond wires 101B and 101D.

In wire bond wire pattern 194, bases of wire bond wires 101B and 101D are offset-aligned to one another, so gaps between wire bond wires 101B correspond to bases of wire bond wires 101D, and gaps between wire bond wires 101D correspond to bases of wire bond wires 101B. This arrangement or pattern may be useful for forming a unidirectional mesh for a combination of fence-like EMI shield perimeters formed by wire bond wires 101B and 101D.

Figure 16:
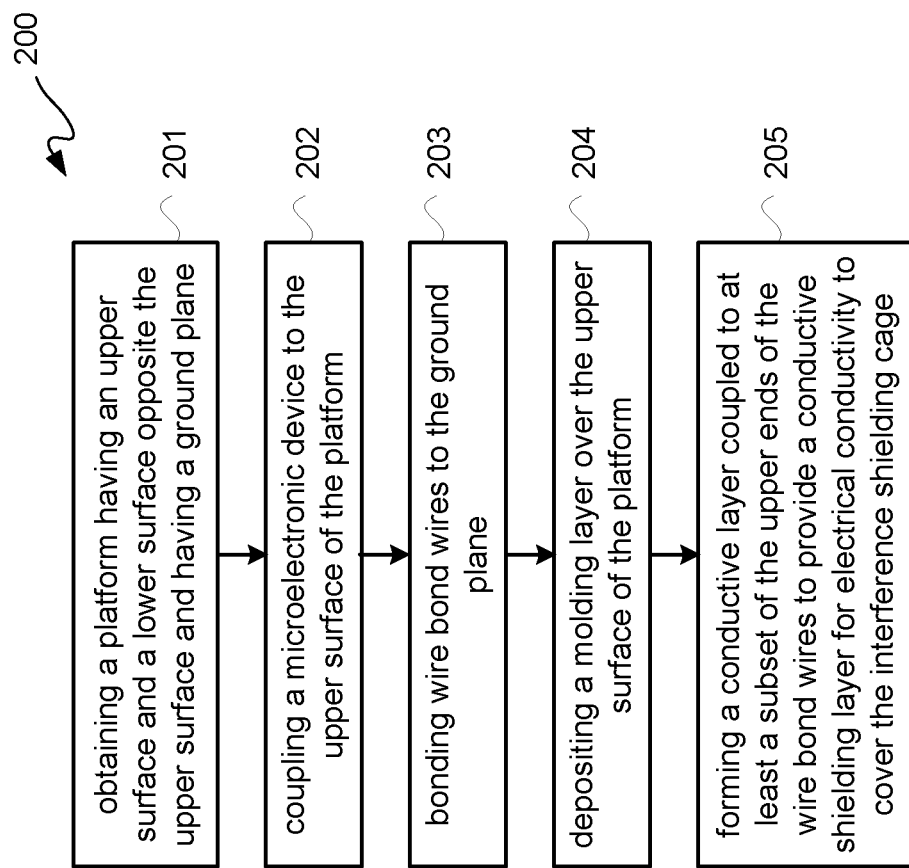
FIG. 16 is a flow diagram illustratively depicting a process for forming a microelectronic package having wire bond wire interference shielding.

FIG. 16 is a flow diagram illustratively depicting a EMI shield forming process 200 for forming a microelectronic package 100 having wire bond wires 101 for interference shielding for protection from EMI. Process 200 is further described with simultaneous reference to FIGS. 1 through 16.

At 201, a platform 104 is obtained having an upper surface 102 and a lower surface 106 opposite upper surface 102 and having a ground plane 107. At 202, a microelectronic device 105 is coupled to upper surface 102 of platform 104. At 203, wire bond wires 101 are wire bonded, such as ball, wedge or stitch bonded, for electrical interconnection with ground plane 107. Such wire bond wires 101 may have a pitch, as previously described. Wire bond wires 101 extend away from upper surface 102 of platform 104 with upper ends of wire bond wires 101 being above an upper surface of microelectronic device 105. Such wire bond wires 101 are spaced apart from one another to provide a fence-like perimeter to provide at least one interference shielding cage, such as previously described. At 204, a molding layer 113 may be deposited over upper surface 102 of platform 104, as previously described. At 205, a conductive layer may be formed, as previously described, for being coupled to at least a subset of upper ends of wire bond wires 101 for electrical conductivity to provide a conductive shielding layer 112 and/or 122 to cover such an interference shielding cage 111 and/or 121. Along those lines, operation 202 may be for coupling multiple microelectronic devices to an upper surface of a platform, and operation 203 may be for forming multiple wire bond perimeters, such as described elsewhere herein. Thus, at operation 205 one or more conductive layers may be formed.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A microelectronic device, comprising:
    a first device disposed on a platform;
    a second device disposed on the platform;
    a first interference shield comprising a first plurality of wire bond wires, wherein the first device and the second device are separated from one another by the first interference shield;
    a second interference shield comprising a second plurality of wire bond wires, wherein the first device and the second device are separated from one another by the second interference shield;
    a first spacing between a first adjacent pair of wire bond wires in the first interference shield,
wherein the first spacing attenuates electromagnetic radiation below a first frequency; and
    a second spacing between a second adjacent pair of wire bond wires in the second interference shield, wherein:
        the second spacing is larger than the first spacing;
        the second spacing attenuates electromagnetic radiation below a second frequency; and
        the second frequency is different than the first frequency.

2. The microelectronic device of claim 1, wherein the platform is a leadframe.

3. The microelectronic device of claim 1, wherein the platform is a circuit board.

4. The microelectronic device of claim 1, wherein the platform is a substrate.

5. The microelectronic device of claim 1, wherein the platform is a redistribution layer.

6. The microelectronic device of claim 1, wherein the platform is a silicon substrate.

7. The microelectronic device of claim 1, wherein the first device is coupled to the second device though a gap between wire bond wires in the first interference shielding.

8. The microelectronic device of claim 1, further comprising a third device disposed on the platform.

9. The microelectronic device of claim 8, wherein the first interference shield and the second interference shield are between the third device and the second device.

10. The microelectronic device of claim 9, further comprising a third interference shield comprising a third plurality of wire bond wires, wherein the third device and the first device are separated from one another by the third interference shield.

11. The microelectronic device of claim 10, further comprising a third spacing between a third adjacent pair of wire bond wires in the third interference shield, wherein the third spacing attenuates electromagnetic radiation below the first frequency.

12. The microelectronic device of claim 1, wherein:
    the first spacing is about 1/10th or less than a first wavelength of electromagnetic radiation of the first frequency; and
    the second spacing is about 1/10th or less than a second wavelength of electromagnetic radiation of the second frequency.

13. The microelectronic device of claim 11, wherein:
    the first and third spacings are about 1/10th or less than the first wavelength of electromagnetic radiation of the first frequency; and
    the second spacing is about 1/10th or less than the second wavelength of electromagnetic radiation of the second frequency.

14. The microelectronic device of claim 1, wherein
    the first interference shield attenuates electromagnetic radiation below the first frequency by about 97% or more; and
    the second interference shield attenuates electromagnetic radiation below the second frequency by about 97% or more.

15. The microelectronic device of claim 11, wherein
    the first and third interference shields attenuates electromagnetic radiation below first frequency by about 97% or more; and
    the second interference attenuates electromagnetic radiation below the second frequency by about 97% or more.

* * * * *